US012733322B2

(12) United States Patent
Aoki

(10) Patent No.: US 12,733,322 B2
(45) Date of Patent: Sep. 8, 2026

(54) DISPLAY DEVICE

(71) Applicant: Japan Display Inc., Tokyo (JP)

(72) Inventor: Yoshinori Aoki, Tokyo (JP)

(73) Assignee: Japan Display Inc., Tokyo (JP)

( * ) Notice: Subject to any disclaimer, the term of this patent is extended or adjusted under 35 U.S.C. 154(b) by 337 days.

(21) Appl. No.: 18/410,126

(22) Filed: Jan. 11, 2024

(65) Prior Publication Data

US 2024/0243240 A1 Jul. 18, 2024

(30) Foreign Application Priority Data

Jan. 13, 2023 (JP) ................................ 2023-003860

(51) Int. Cl.
*H10H 20/857* (2025.01)
*H10W 90/00* (2026.01)

(52) U.S. Cl.
CPC .......... *H10H 20/857* (2025.01); *H10W 90/00* (2026.01)

(58) Field of Classification Search
CPC ...... H10H 20/80; H10H 20/85; H10H 20/857; H10H 29/30; H10H 29/32; H10H 29/34; H10H 29/40; H10W 90/00
USPC ........................................................... 257/91
See application file for complete search history.

(56) References Cited

U.S. PATENT DOCUMENTS 10,162,207 B2 12/2018 Lee et al.
12,255,192 B2 3/2025 Ikeda et al.
2004/0070708 A1* 4/2004 Kurashina ......... G02F 1/136213 349/110
2020/0212102 A1* 7/2020 Park ...................... H10W 90/00
2021/0126016 A1* 4/2021 Li ........................ H10D 86/441
2021/0241684 A1* 8/2021 Ogawa ..................... G09G 3/32
2021/0296548 A1* 9/2021 Hayashi ............... H10H 20/857
2022/0231109 A1* 7/2022 Liu ....................... H10W 90/00
2024/0021627 A1* 1/2024 Kim .................... H10D 86/441

FOREIGN PATENT DOCUMENTS

JP H0773100 A 3/1995
JP 2020003808 A 1/2020
JP 2020067626 A 4/2020
JP 2022036709 A 3/2022

OTHER PUBLICATIONS

Office Action issued on Jun. 2, 2026, in corresponding Japanese Application No. 2023-003860, 10 pages.

* cited by examiner

*Primary Examiner* — Mounir S Amer
*Assistant Examiner* — Nicholas B Michaud
(74) *Attorney, Agent, or Firm* — Maier & Maier, PLLC

(57) ABSTRACT

A first wiring layer of a display device includes a first terminal pattern electrically connected to an anode electrode of an LED element and a second terminal pattern electrically connected to a cathode electrode. A second wiring layer includes a first conductor pattern made of light shielding metal and electrically connected to the first terminal pattern via a first contact hole and a second conductor pattern electrically connected to the second terminal pattern via a second contact hole. The second conductor pattern is arranged so as to be spaced apart from the first conductor pattern and surround a periphery of the first conductor pattern in plan view. A switching element (drive transistor) is covered with the second conductor pattern.

6 Claims, 11 Drawing Sheets

Figure 5:
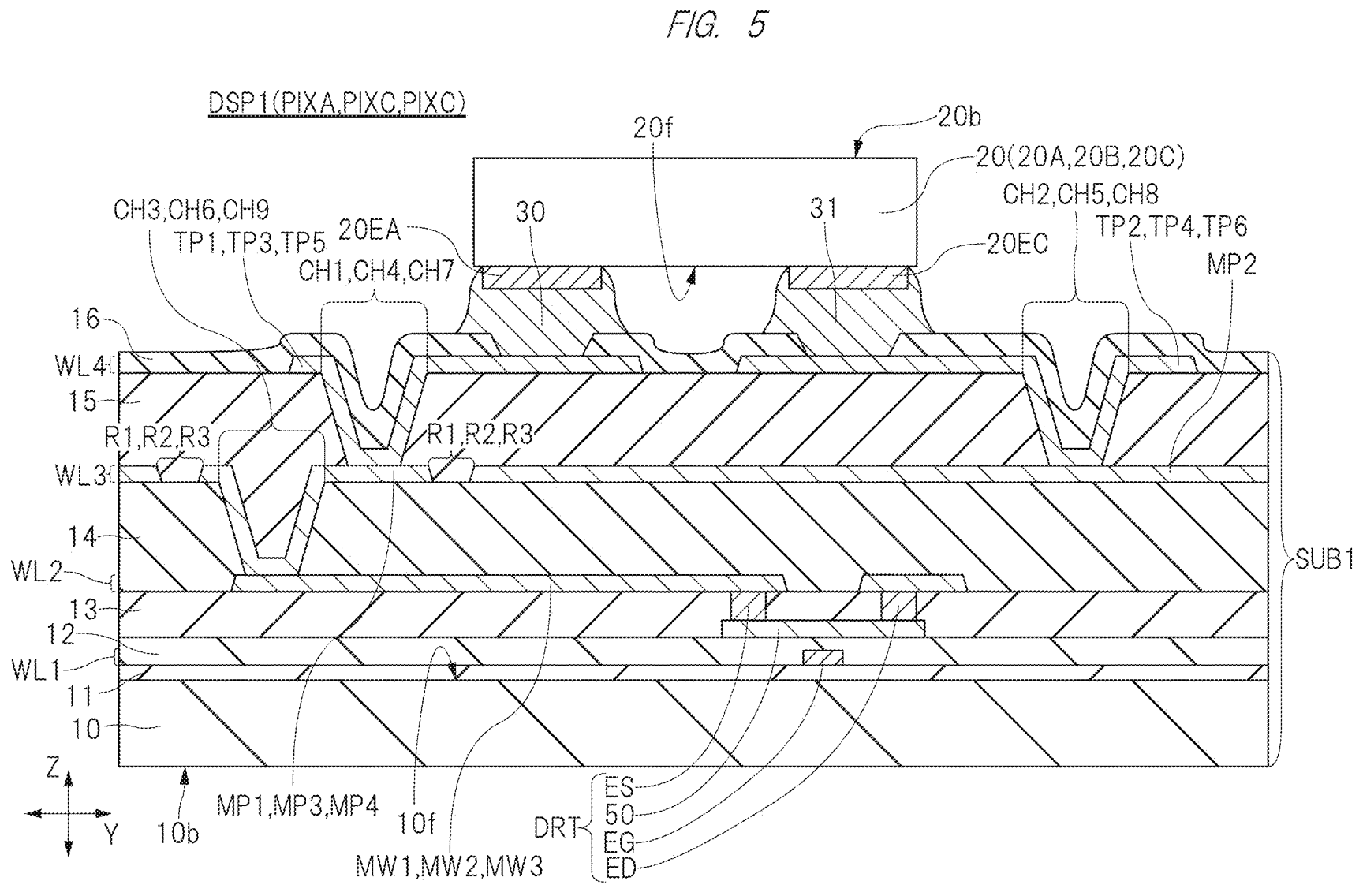

DSP1(PIXA,PIXC,PIXC)
20b
20(20A,20B,20C)
CH2,CH5,CH8
TP2,TP4,TP6
MP2
SUB1
20EC
31
30
20f
CH3,CH6,CH9
TP1,TP3,TP5
20EA
CH1,CH4,CH7
R1,R2,R3
R1,R2,R3
MP1,MP3,MP4
10f
MW1,MW2,MW3
DRT
ES
50
EG
ED
10b
16
WL4
15
WL3
14
WL2
13
12
WL1
11
10
Z
Y

FIG. 7

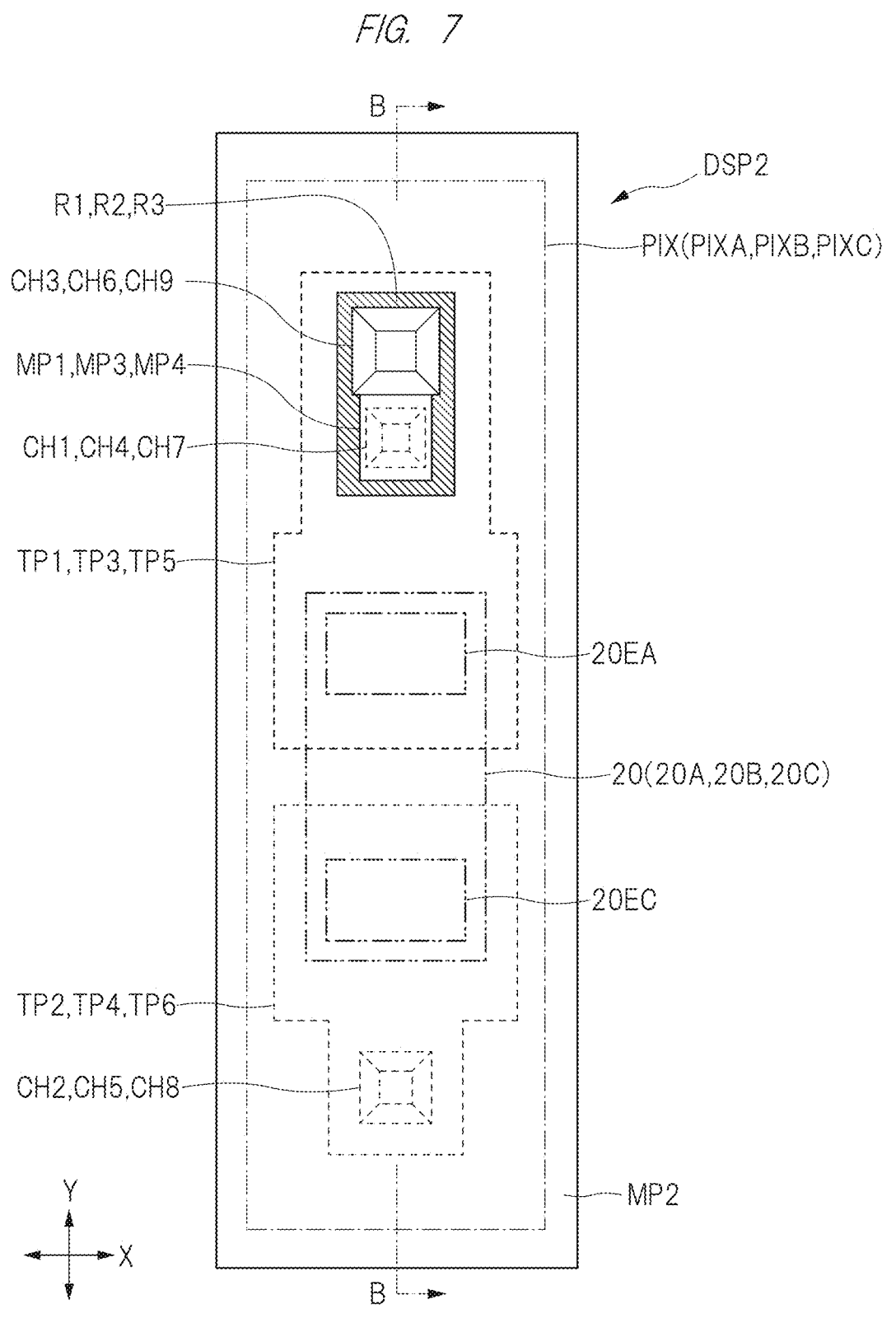

B
DSP2
R1,R2,R3
PIX(PIXA,PIXB,PIXC)
CH3,CH6,CH9
MP1,MP3,MP4
CH1,CH4,CH7
TP1,TP3,TP5
20EA
20(20A,20B,20C)
20EC
TP2,TP4,TP6
CH2,CH5,CH8
MP2
Y
X
B

DSP2(PIXA,PIXC,PIXC)
20f
20b
20(20A,20B,20C)
30
31
CH3,CH6,CH9
TP1,TP3,TP5
20EA
CH1,CH4,CH7
CH2,CH5,CH8
TP2,TP4,TP6
20EC
MP2
16
WL4
15
R1,R2,R3
R1,R2,R3
WL3
14
WL2
13
12
WL1
11
10
SUB1
Z
Y
10b
MP1,MP3,MP4
10f
MW1,MW2,MW3
DRT
ES
50
EG
ED

DSP3(PIXA)
20b
20f
20(20A)
30
31
CH3
TP1
20EA
CH1
20EC
TP2
MP2
16
WL4
15
R1
R1
WL3
14
WL2
13
12
WL1
11
10
SUB1
Z
Y
10b
MP1
10f
MW1
DRT
ES
50
EG
ED

DISPLAY DEVICE

CROSS REFERENCE TO RELATED APPLICATIONS

The present application claims priority to Japanese Patent Application No. 2023-003860 filed on Jan. 13, 2023, the disclosure of which is incorporated herein by reference.

TECHNICAL FIELD

The present invention relates to a display device.

BACKGROUND

As a display device, a light emitting diode (LED) display device in which light emitting diode elements which are self-luminous elements are arranged in a matrix on a substrate has been known. For example, Japanese Unexamined Patent Application Publication No. 2020-67626 (Patent Document 1) discloses a display device in which a plurality of micro LEDs are arranged on a substrate.

SUMMARY

The LED display device forms a display image by controlling operations of a large number of LED elements mounted on a substrate by using switching elements. A thin film transistor is used as the switching element, but if the switching element is irradiated with light emitted from the LED element, a leakage current is generated in the switching element, and this causes the decrease in luminance in some cases. On the other hand, when the degree of freedom in design is taken into consideration, it is preferable that obstructive factors to the positions of the switching elements and the LED elements in plan view are reduced as much as possible.

A display device according to an embodiment includes: a first substrate; a first switching element arranged on the first substrate; a plurality of wiring layers stacked on the first substrate; a plurality of insulating layers arranged between the plurality of wiring layers; and a first inorganic light emitting diode element having a first electrode and a second electrode and mounted on a first wiring layer arranged as an uppermost layer among the plurality of wiring layers. The plurality of wiring layers include the first wiring layer, a second wiring layer, and a third wiring layer sequentially stacked from the first wiring layer toward the first substrate. The plurality of insulating layers include: a first insulating layer arranged between the first wiring layer and the second wiring layer; and a second insulating layer arranged between the second wiring layer and the third wiring layer. The first wiring layer includes: a first terminal pattern electrically connected to the first electrode; and a second terminal pattern electrically connected to the second electrode. The second wiring layer includes: a first conductor pattern made of light shielding metal and electrically connected to the first terminal pattern via a first contact hole formed in the first insulating layer; and a second conductor pattern made of the same metal as the first conductor pattern and electrically connected to the second terminal pattern via a second contact hole formed in the first insulating layer. The third wiring layer includes a first wiring pattern electrically connected to the first conductor pattern via a third contact hole formed in the second insulating layer and electrically connected to an electrode of the first switching element. The second conductor pattern is arranged so as to be spaced apart from the first conductor pattern and surround a periphery of the first conductor pattern in plan view. The first switching element is covered with the second conductor pattern.

BRIEF DESCRIPTION OF DRAWINGS

FIG. 4 is a transparent enlarged plan view showing one of three pixels (sub-pixels) shown in FIG. 3 in an enlarged manner;

FIG. 5 is an enlarged cross-sectional view taken along the line A-A in FIG. 4;

FIG. 7 is a transparent enlarged plan view showing a modification with respect to FIG. 4;

DETAILED DESCRIPTION OF THE INVENTION

Figure 1:
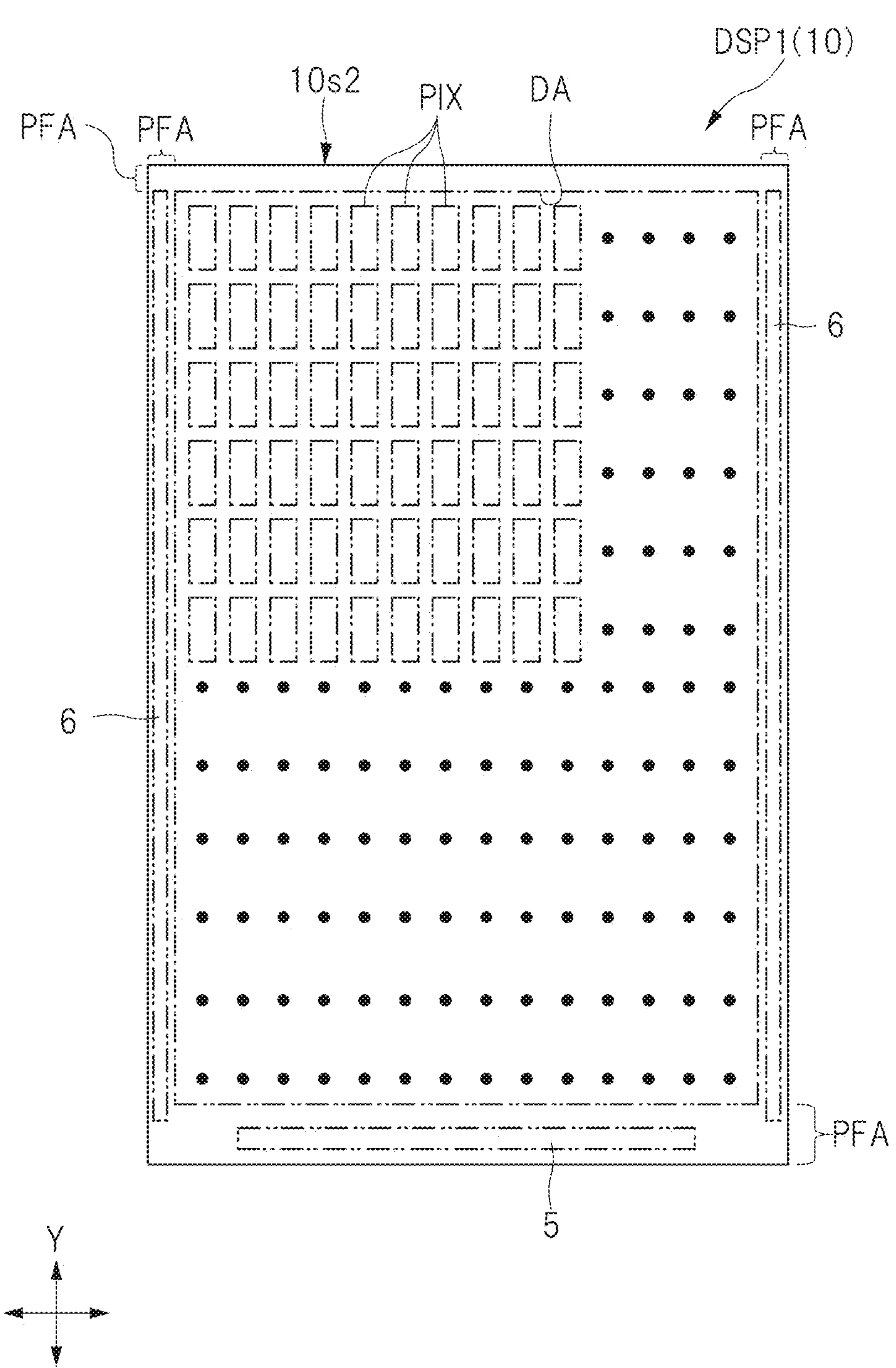
FIG. 1 is a plan view showing a configuration example of a display device according to an embodiment.

Hereinafter, each embodiment of the present invention will be described with reference to drawings. Note that the disclosure is merely an example, and it is a matter of course that any alteration that is easily made by a person skilled in the art while keeping a gist of the present invention is included in the range of the present invention. In addition, the drawings schematically illustrate a width, a thickness, a shape, and the like of each portion as compared with actual aspects in order to make the description clearer, but the drawings are merely examples and do not limit the interpretation of the present invention. Further, the same elements as those described in relation to the foregoing drawings are denoted by the same or related reference characters in this specification and the respective drawings, and detailed descriptions thereof will be omitted as appropriate.

In the following embodiment, a micro LED display device including a plurality of micro LED elements will be described as an example of a display device using a plurality of inorganic light emitting elements. Since a micro LED element has a smaller element size (outer diameter) than a general LED element, it has the advantage of being able to display a high-definition image.

Note that an organic light emitting diode (OLED) element is known as an example of a light emitting diode element that is a self-luminous element. The inorganic light emitting diode element (micro LED element) described in the following embodiment is distinguished from an organic light emitting diode element. In the case of the display device using the inorganic light emitting diode element, the reliability of the LED element is higher than that of the display device using the organic light emitting diode element, so it is expected to be used in applications where higher luminance is required.

<Display Device>

Figure 2:
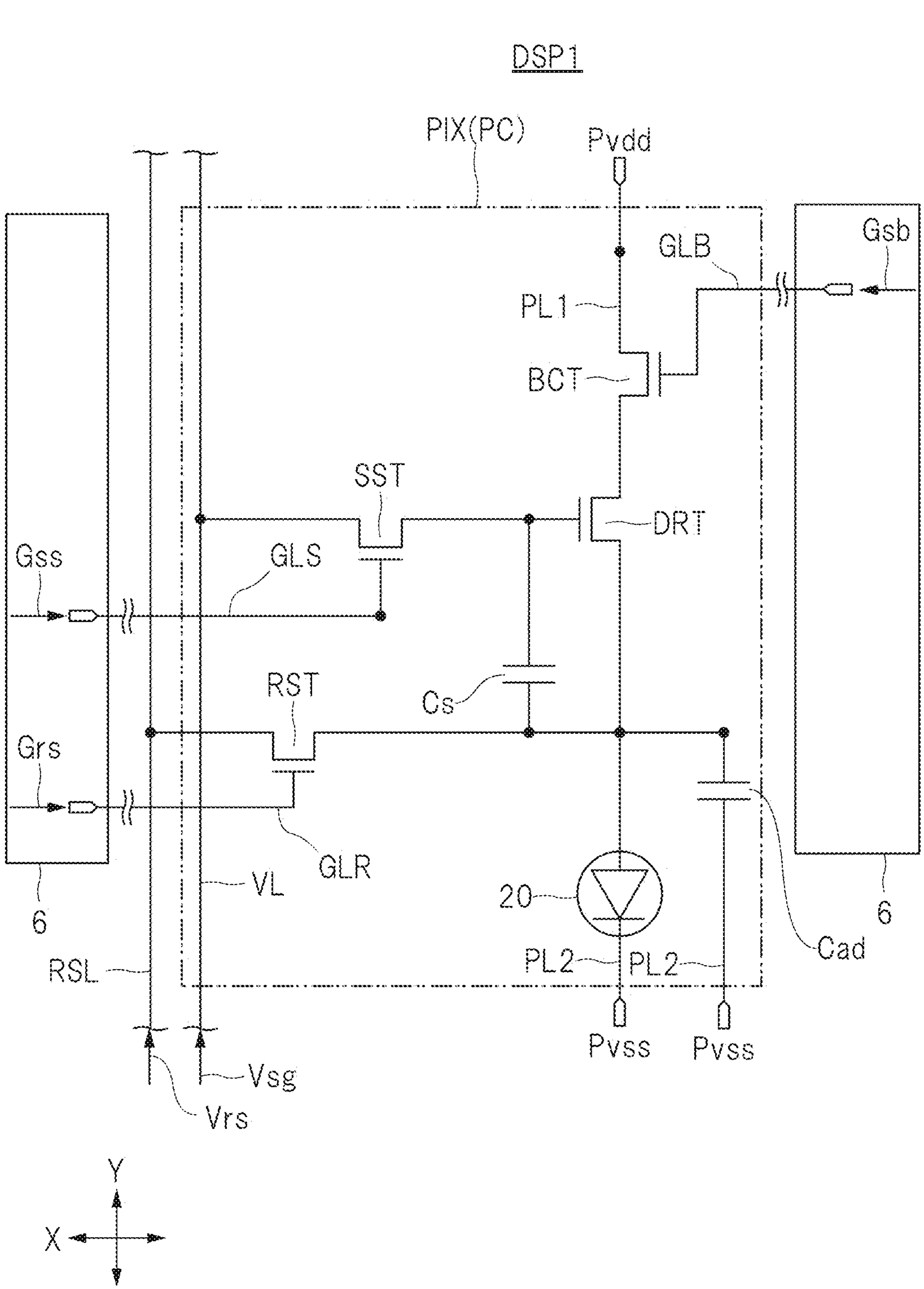
FIG. 2 is a circuit diagram showing a configuration example of a circuit around a pixel shown in FIG. 1.

First, a configuration example of a micro LED display device, which is a display device of this embodiment, will be described. FIG. 1 is a plan view showing a configuration example of a display device according to an embodiment. In FIG. 1, the boundary between a display region DA and a peripheral region PFA, a control circuit 5, a drive circuit 6, and each of a plurality of pixels PIX are indicated by double-dot dashed lines. FIG. 2 is a circuit diagram showing a configuration example of a circuit around the pixel shown in FIG. 1. Note that a pixel circuit PC in FIG. 2 shows an example of an equivalent circuit corresponding to one pixel PIX shown in FIG. 1.

FIG. 1 illustrates the X direction and the Y direction. The X direction and the Y direction intersect with each other. In the example described below, the X direction is orthogonal to the Y direction. In the following, an X-Y plane including the X direction and the Y direction will be described as a plane parallel to a display surface of the display device. In the following description, "in plan view" means the case where a plane parallel to the X-Y plane is viewed, unless it is explicitly stated that it should be interpreted in different meaning. Furthermore, as will be described later, the normal direction with respect to the X-Y plane will be referred to as the "z direction" or the thickness direction. The X direction, the Y direction, and the Z direction are directions that intersect with each other, and more specifically, are directions that are orthogonal to each other.

In the description of this specification, it is sometimes described that "A" is "covered" with "B". "A is covered with B" means that the entirety of A overlaps with B in plan view showing the above-mentioned X-Y plane. Moreover, "A is covered with B" can also be paraphrased as "the entirety of A overlaps with B in the above-mentioned thickness direction (Z direction)".

As shown in FIG. 1, a display device DSP1 of this embodiment includes the display region DA, the peripheral region PFA surrounding the display region DA in a frame shape, and the plurality of pixels PIX arranged in a matrix in the display region DA. Further, the display device DSP1 includes a substrate 10, the control circuit 5 formed on the substrate 10, and the drive circuit 6 formed on the substrate 10.

The control circuit 5 is a control circuit configured to control driving of the display function of the display device DSP1. For example, the control circuit 5 is a driver IC (Integrated Circuit) mounted on the substrate 10. In the example shown in FIG. 1, the control circuit 5 is arranged along one short side of the four sides of the substrate 10. Furthermore, in an example of this embodiment, the control circuit 5 includes a signal line drive circuit (video driver) configured to drive a video signal line VL (see FIG. 2) connected to the plurality of pixels PIX. However, the position and configuration example of the control circuit 5 are not limited to those in the example shown in FIG. 1, and there are various modifications. For example, in FIG. 1, a circuit board such as a flexible board is connected to the position shown as the control circuit 5, and the above-described driver IC may be mounted on the circuit board. Further, for example, the signal line drive circuit configured to drive the video signal line VL may be formed separately from the control circuit 5.

The drive circuit (scan driver) 6 is a circuit configured to drive scan signal lines GLB, GLR, and GLS in the plurality of pixels PIX. The drive circuit 6 drives the plurality of scan signal lines GL based on control signals from the control circuit 5. In the example shown in FIG. 1, the drive circuit 6 is arranged along each of two long sides of the four sides of the substrate 10. In the example shown in FIG. 1, the display region DA is arranged between the two drive circuits 6 in plan view. However, the position and configuration example of the drive circuit 6 are not limited to those in the example shown in FIG. 1, and there are various modifications. For example, in FIG. 1, a circuit board such as a flexible board is connected to the position shown as the control circuit 5, and the above-described drive circuit 6 may be mounted on the circuit board.

Next, a configuration example of the pixel circuit PC configured to drive the pixel PIX shown in FIG. 1 will be described with reference to FIG. 2. Note that FIG. 2 illustrates one pixel circuit PC configured to drive one pixel representatively. Each of the plurality of pixels PIX shown in FIG. 1 includes the circuit similar to the pixel circuit PC shown in FIG. 2. The pixel circuit PC is a voltage signal circuit configured to control the light emission state of an LED element 20 according to a video signal Vsg supplied from the control circuit 5 (see FIG. 1).

As shown in FIG. 2, the pixel PIX includes the LED element 20. The LED element 20 is a micro light emitting diode mentioned above. The LED element 20 has an anode electrode 20EA (see FIG. 3 described later) and a cathode electrode 20EC (see FIG. 3 described later).

The display device DSP1 includes different types of wirings in the display region DA. These wirings include a plurality of scan signal lines GLS, GLR, and GLB, a plurality of video signal lines VL, a plurality of power supply lines PL1, a plurality of power supply lines PL2, and a plurality of reset wirings RSL.

The scan signal lines GLS, GLR, and GLB extend in the X direction and are connected to the drive circuit 6. For example, as shown in FIG. 1, the scan signal lines GLS, GLR, and GLB for driving even-numbered pixels PIX among the pixels PIX arranged in the Y direction are connected to one drive circuit 6, and the scan signal lines GLS, GLR, and GLB for driving odd-numbered pixels PIX are connected to the other drive circuit 6. As another example, any of the scan signal lines GLS, GLR, and GLB may be connected to one drive circuit 6 and the rest may be connected to the other drive circuit 6. Specifically, the scan signal lines GLS and GLR may be all connected to one drive circuit 6 and the scan signal lines GLB may be all connected to the other drive circuit 6.

The video signal line VL, the power supply lines PL1 and PL2, and the reset wiring RSL extend in the Y direction. The video signal line VL is connected to the control circuit 5 (see FIG. 1). The video signal Vsg and an initialization signal are supplied from the control circuit 5 to the video signal line VL. A high potential Pvdd is supplied from the control circuit 5 to the power supply line PL1. A low potential Pvss lower than the high potential Pvdd is supplied from the control circuit 5 to the power supply line PL2. A reset signal Vrs is supplied from the control circuit 5 to the reset wiring RSL.

The control circuit 5 outputs a start pulse signal and a clock signal (not shown) to the drive circuit 6. The drive circuit 6 includes a plurality of shift register circuits, sequentially transfers the start pulse signal to a shift register circuit on the next stage according to the clock signal, and sequentially supplies a scan signal to each of the scan signal lines GLS, GLR, and GLB.

The pixel circuit PC controls the LED element 20 according to the video signal Vsg supplied to the video signal line VL. In order to realize such control, the pixel circuit PC in this embodiment includes a reset transistor (switching element) RST, a pixel selection transistor (switching element) SST, an output transistor (switching element) BCT, a drive transistor (switching element) DRT, a holding capacitor Cs, and an auxiliary capacitor Cad. The auxiliary capacitor Cad is an element provided to adjust the amount of light emitting current, and may be unnecessary depending on cases.

The reset transistor RST, the pixel selection transistor SST, the output transistor BCT, and the drive transistor DRT are switching elements made of thin film transistors (TFTs). The conductivity type of the thin film transistors is not particularly limited. For example, all the transistors may be composed of N-channel TFTs or at least one of them may be composed of a P-channel TFT.

In this embodiment, the reset transistor RST, the pixel selection transistor SST, the output transistor BCT, and the drive transistor DRT are formed in the same process and the same layer structure, and have a bottom gate structure using polycrystalline silicon for a semiconductor layer. As another example, the reset transistor RST, the pixel selection transistor SST, the output transistor BCT, and the drive transistor DRT may have a top gate structure. Note that, as the semiconductor layer, an oxide semiconductor, a polycrystalline GaN semiconductor, or the like may be used.

The reset transistor RST, the pixel selection transistor SST, the output transistor BCT, and the drive transistor DRT each have a source electrode, a drain electrode, and a gate electrode. The gate electrode provided in each transistor can be referred to as a control electrode. Furthermore, the source electrode and the drain electrode provided in each transistor can be simply referred to as electrodes.

The drive transistor DRT and the output transistor BCT are connected in series with the LED element 20 between the power supply line PL1 and the power supply line PL2. The high potential Pvdd supplied to the power supply line PL1 is set to, for example, 10 V, and the low potential Pvss supplied to the power supply line PL2 is set to, for example, 1.5 V.

The drain electrode of the output transistor BCT is connected to the power supply line PL1. The source electrode of the output transistor BCT is connected to the drain electrode of the drive transistor DRT. The gate electrode of the output transistor BCT is connected to the scan signal line GLB. The output transistor BCT is turned on and off by a control signal Gsb supplied to the scan signal line GLB. Here, ON represents a conductive state, and OFF represents a non-conductive state. The output transistor BCT controls the light emission time of the LED element 20 based on the control signal Gsb.

The source electrode of the drive transistor DRT is connected to one electrode (here, anode) of the LED element 20. The other electrode (here, cathode) of the LED element 20 is connected to the power supply line PL2. The drive transistor DRT outputs a drive current according to the video signal Vsg to the LED element 20.

The source electrode of the pixel selection transistor SST is connected to the video signal line VL. The drain electrode of the pixel selection transistor SST is connected to the gate electrode of the drive transistor DRT. The gate electrode of the pixel selection transistor SST is connected to the scan signal line GLS that functions as a gate wiring for signal writing control. The pixel selection transistor SST is turned on and off by a control signal Gss supplied from the scan signal line GLS, and switches connection and disconnection between the pixel circuit PC and the video signal line VL. Namely, by turning on the pixel selection transistor SST, the video signal Vsg or the initialization signal of the video signal line VL is supplied to the gate electrode of the drive transistor DRT.

The source electrode of the reset transistor RST is connected to the reset wiring RSL. The drain electrode of the reset transistor RST is connected to the source electrode of the drive transistor DRT and the anode of the LED element 20. The gate electrode of the reset transistor RST is connected to the scan signal line GLR that functions as a gate wiring for reset control. The reset transistor RST is turned on and off by a control signal Grs supplied from the scan signal line GLR. By turning on the reset transistor RST, the potentials of the source electrode of the drive transistor DRT and the anode of the LED element 20 can be reset to the reset signal Vrs of the reset wiring RSL. Namely, the reset wiring RSL is a wiring for resetting the voltage of the LED element 20.

The holding capacitor Cs is connected between the gate electrode and the source electrode of the drive transistor DRT. The auxiliary capacitor Cad is connected between the source electrode of the drive transistor DRT and the power supply line PL2.

The control signals Gss, Grs, and Gsb are sequentially supplied by the drive circuit 6 to the scan signal lines GLS, GLR, and GLB of each row (a series of pixels PIX arranged in the X direction) based on the above-mentioned start pulse signal and clock signal. Further, the control circuit 5 sequentially supplies the video signal Vsg and the initialization signal to each video signal line VL based on the signal supplied from the control circuit 5 shown in FIG. 2. The charges held in the holding capacitor Cs by the supply of the video signal Vsg are initialized by the supply of the initialization signal.

In the configuration described above, the pixel circuit PC is driven by the control signals Gss, Grs, and Gsb supplied to the scan signal lines GLS, GLR, and GLB, and the LED element 20 emits light with the luminance according to the video signal Vsg of the video signal line VL.

<Peripheral Structure of LED Element>

Figure 3:
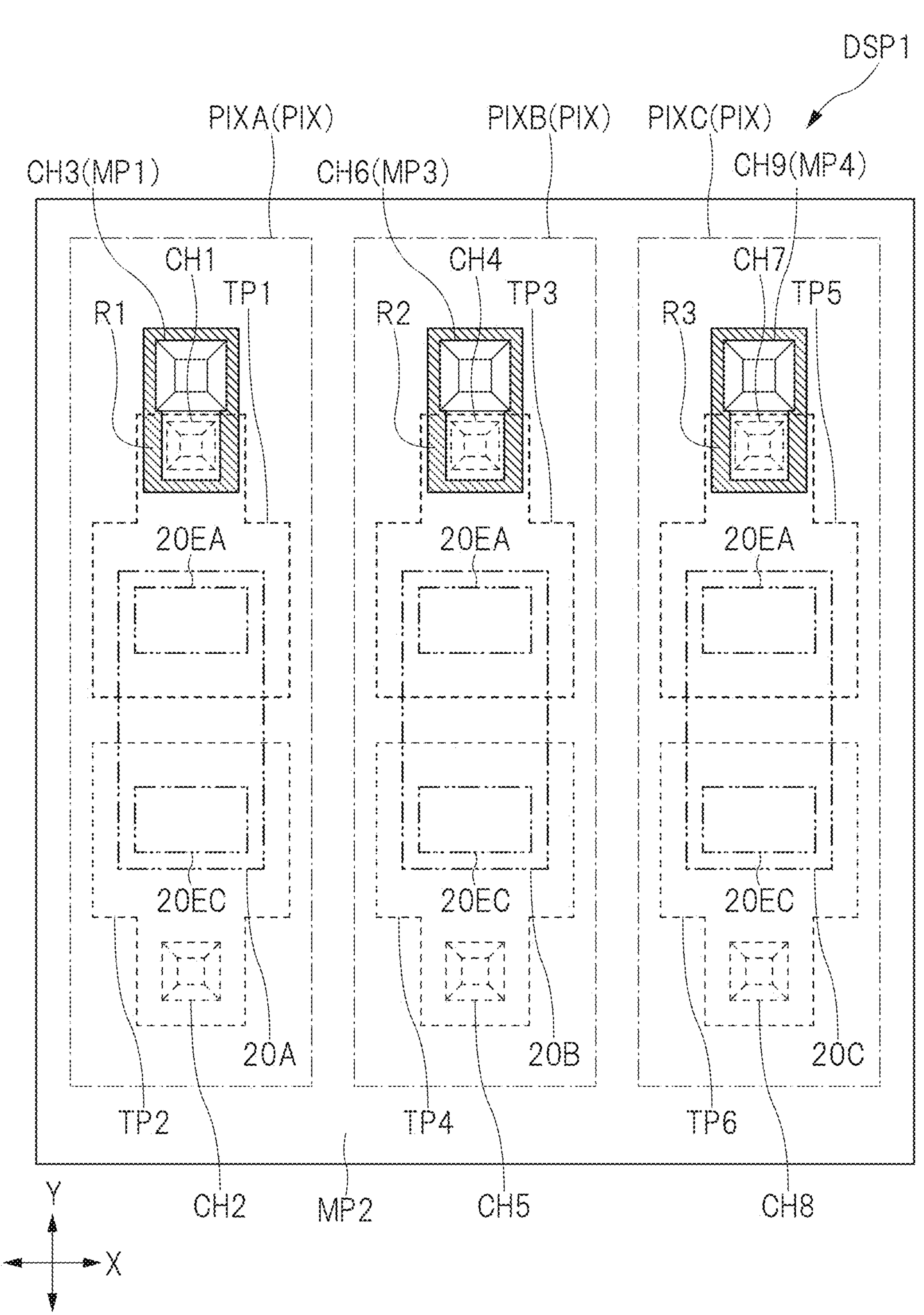
FIG. 3 is a transparent enlarged plan view showing an example of a peripheral structure of an LED element arranged in each of the plurality of pixels of the display device shown in FIG. 1.
Figure 4:
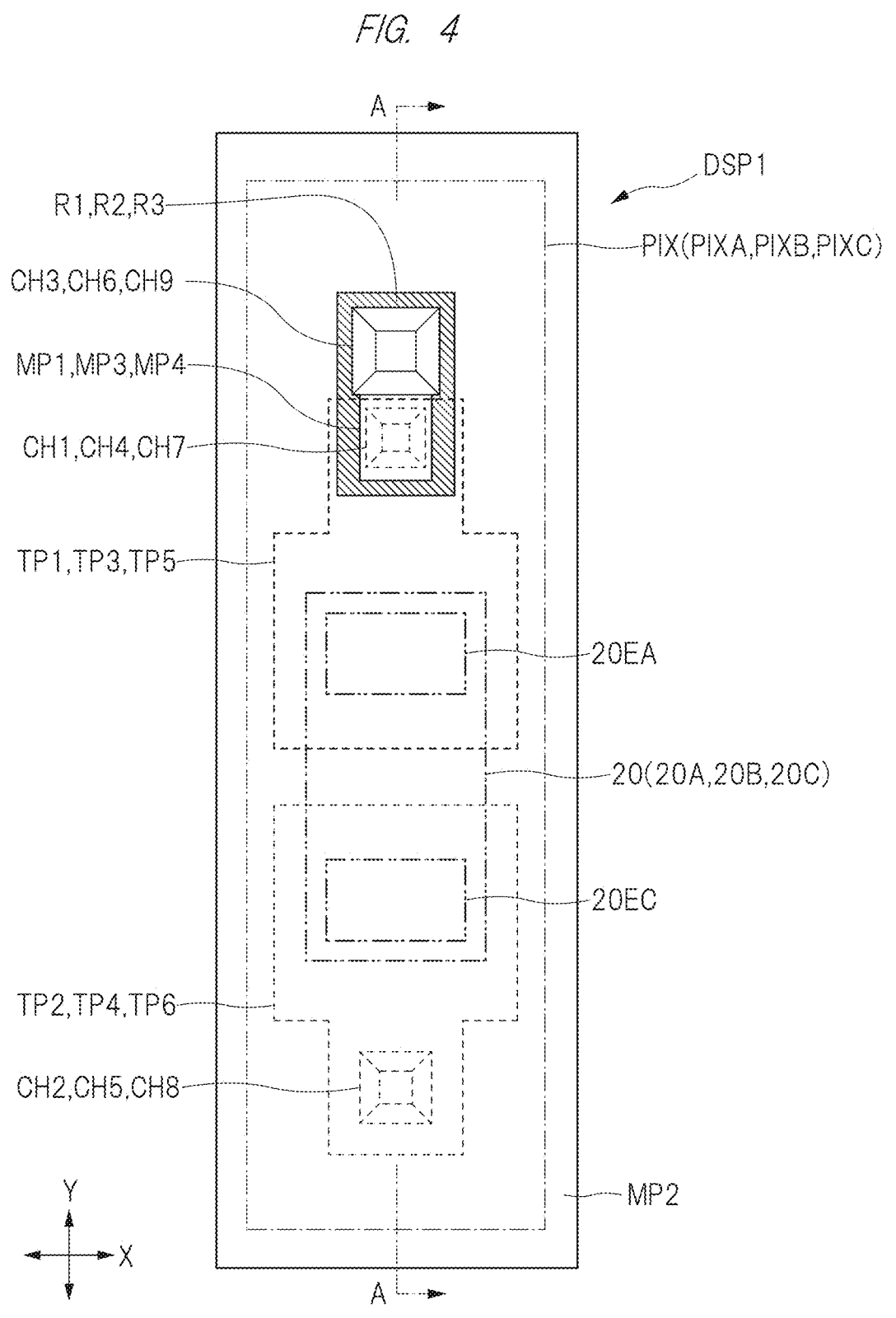
Figure 6:
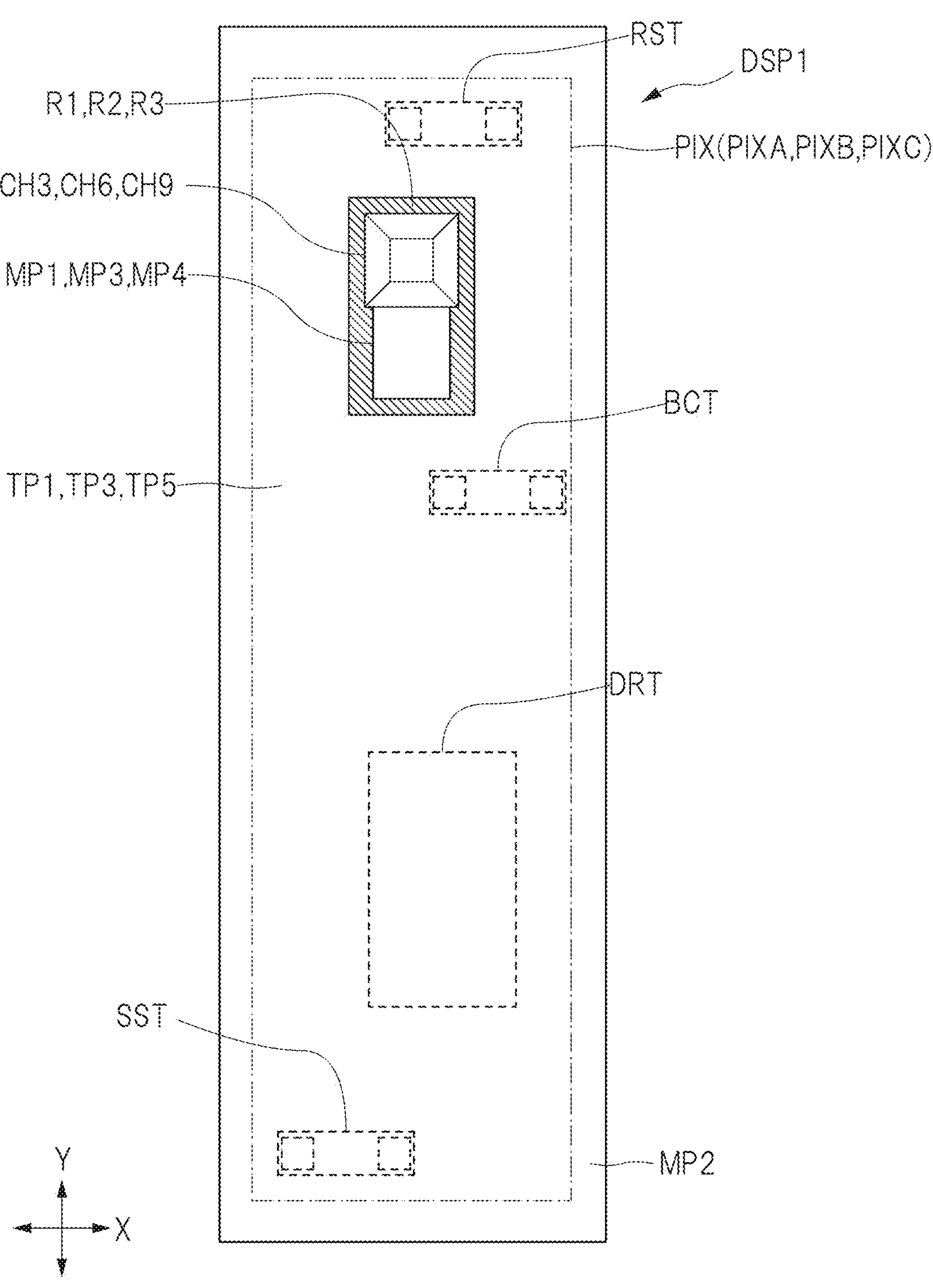
FIG. 6 is an enlarged plan view showing an example of a planar positional relationship between each of a plurality of transistors shown in FIG. 2 and a conductor pattern entirely covering them.

Next, the peripheral structure of the LED element arranged in the pixel PIX shown in FIG. 1 will be described. FIG. 3 is a transparent enlarged plan view showing an example of a peripheral structure of an LED element arranged in each of the plurality of pixels of the display device shown in FIG. 1. FIG. 4 is a transparent enlarged plan view showing one of three pixels (sub-pixels) shown in FIG. 3 in an enlarged manner. FIG. 5 is an enlarged cross-sectional view taken along the line A-A in FIG. 4. FIG. 6 is an enlarged plan view showing an example of a planar positional relationship between each of the plurality of transistors shown in FIG. 2 and a conductor pattern entirely covering them. In FIG. 3 and FIG. 4, the conductor pattern arranged in a wiring layer WL3 shown in FIG. 5 is indicated by solid lines, the conductor pattern (terminal pattern) arranged in a wiring layer WL4 is indicated by dotted lines, and outlines of the LED element 20 and the electrodes of the LED element 20 are indicated by double-dot dashed lines. Moreover, a pixel PIXA, a pixel PIXB, and a pixel PIXC shown in FIG. 3 each have the same structure. Therefore, the structure of one pixel PIX (see FIG. 4) is shown as a representative example in FIG. 4 and FIG. 5, and is denoted by reference characters corresponding to each of the pixel PIXA, the pixel PIXB, and the pixel PIXC. Further, although FIG. 3 and FIG. 4 are plan views, a region R1 between a conductor pattern MP1 and a conductor pattern MP2 is hatched so as to clearly indicate the range of the region R1.

Further, the pixel circuit PC shown in FIG. 2 is a circuit corresponding to each of the pixel PIXA, the pixel PIXB, and the pixel PIXC shown in FIG. 3. Therefore, each of the pixel PIXA, the pixel PIXB, and the pixel PIXC shown in FIG. 3 includes the reset transistor RST, the pixel selection transistor SST, the output transistor BCT, and the drive transistor DRT described with reference to FIG. 2. Similarly, each of the pixel PIXA, the pixel PIXB, and the pixel PIXC shown in FIG. 3 has the holding capacitor Cs and the auxiliary capacitor Cad described with reference to FIG. 2.

As shown in FIG. 5, the display device DSP1 includes a substrate structure SUB1 including a plurality of wiring layers stacked on the substrate 10 and the LED element (inorganic light emitting diode element) mounted on the substrate structure SUB1. The substrate structure SUB1 of the display device DSP1 includes a plurality of insulating layers arranged between the plurality of wiring layers. The LED element 20 is mounted on the wiring layer WL4 arranged as the uppermost layer among the plurality of wiring layers. Further, the substrate structure SUB1 of the display device DSP1 includes transistors as switching elements. In FIG. 5, the drive transistor DRT is illustrated as an example of the switching element arranged on the substrate 10. However, on the substrate 10 (more specifically, on the insulating layer 11), the reset transistor RST, the pixel selection transistor SST, the output transistor BCT, and the drive transistor DRT described with reference to FIG. 2 are arranged. Each of the reset transistor RST, the pixel selection transistor SST, the output transistor BCT, and the drive transistor DRT shown in FIG. 2 has the structure similar to that of the drive transistor DRT shown in FIG. 5 to be described later.

As shown in FIG. 5, the LED element 20 has a surface 20*f* and a surface 20*b* opposite to the surface 20*f*. Further, the LED element 20 includes a plurality of (two in FIG. 3) electrodes arranged on the surface 20*f*. The plurality of electrodes include the anode electrode 20EA and the cathode electrode 20EC. The anode electrode 20EA is electrically connected to a terminal pattern TP1 via a bump electrode 30. The cathode electrode 20EC is electrically connected to a terminal pattern TP2 via a bump electrode 31.

As shown in FIG. 3, the display device DSP1 includes the plurality of LED elements 20. FIG. 3 illustrates an LED element 20A having the anode electrode 20EA and the cathode electrode 20EC, an LED element 20B having the anode electrode 20EA and the cathode electrode 20EC and arranged next to the LED element 20A, and an LED element 20C having the anode electrode 20EA and the cathode electrode 20EC and arranged next to the LED element 20B among the plurality of LED elements 20 in the display device DSP1.

The display device DSP1 displays an image by driving each of the plurality of LED elements 20 mounted on the substrate structure SUB1. The light from the LED element 20 is emitted in all directions from the surface 20*f*, the surface 20*b*, and the four side surfaces.

The substrate 10 has a surface 10*f* and a surface 10*b* opposite to the surface 10*f*. The plurality of wiring layers and the plurality of insulating layers are stacked on the surface 10*f* of the substrate 10. The substrate 10 is, for example, a glass substrate made of glass. However, there are various modifications of the material constituting the substrate 10, and for example, a resin substrate made of a resin may be used.

In the case of the example shown in FIG. 5, the plurality of wiring layers in the display device DSP1 include the wiring layer WL4, the wiring layer WL3, a wiring layer WL2, and a wiring layer WL1 stacked sequentially from the wiring layer WL4 toward the substrate 10. Also, the plurality of insulating layers in the display device DSP1 include the insulating layers 11, 12, 13, 14, 15, and 16 stacked sequentially on the surface 10*f* of the substrate 10.

The insulating layer 11 is a base layer of the thin film transistor and is an inorganic insulating layer made of an inorganic material. The wiring layer WL1 is arranged on the insulating layer 11 and is covered with the insulating layer 12. A conductor pattern formed in the wiring layer WL1 includes a gate electrode EG shown in FIG. 5, the scan signal lines GLB, GLS, and GLR described with reference to FIG. 2, and the like. The insulating layer 12 is also an inorganic insulating layer made of an inorganic material. A part of the insulating layer 12 arranged between the gate electrode EG of the transistor and a semiconductor layer 50 functions as a gate insulating film.

The drive transistor DRT including the gate electrode EG has the semiconductor layer 50, the gate electrode EG, a source electrode ES, and a drain electrode ED. In the example shown in FIG. 5, the thin film transistor having the bottom gate structure is shown as an example, but it may have the top gate structure as described above. The gate electrode EG is arranged on the insulating layer 11. The semiconductor layer 50 is arranged on the insulating layer 12. A part of the semiconductor layer 50 corresponds to the source region, and the source electrode ES is connected to the source region. Another part of the semiconductor layer 50 corresponds to the drain region, and the drain electrode ED is connected to the drain region. A region between the source region and the drain region functions as the channel region.

The wiring layer WL2 is arranged on the insulating layer 13 covering the drive transistor DRT. The insulating layer 13 is an inorganic insulating layer made of an inorganic material. A conductor pattern formed in the wiring layer WL2 includes wirings connected to each of the plurality of transistors. For example, as shown in FIG. 5, a wiring pattern MW1 connected to the source electrode ES of the drive transistor DRT is included in the wiring layer WL2. Further, the conductor pattern formed in the wiring layer WL2 includes the video signal line VL, the power supply line PL1, the power supply line PL2, and the reset wiring RSL shown in FIG. 2.

Each of the insulating layer 14 covering the wiring layer WL2 and the insulating layer 15 stacked on the insulating layer 14 is an organic insulating film made of an organic material. The insulating layer 14 is an insulating layer arranged between the wiring layer WL2 and the wiring layer WL3. The insulating layer 15 is an insulating layer arranged between the wiring layer WL3 and the wiring layer WL4. As shown in FIG. 5, contact holes are used for electrical connection between the wiring layer WL2 and the wiring layer WL3 and electrical connection between the wiring layer WL3 and the wiring layer WL4. Organic insulating layers have better characteristics for filling openings (for example, contact holes) than inorganic insulating layers. In other words, in the case of an organic insulating layer, the upper surface can be easily flattened even if there is an opening in the underlying layer. Therefore, each of the insulating layer 14 and the insulating layer 15 in which a large number of contact holes are formed is made of an organic material.

The wiring layer WL4 is a wiring layer arranged as the uppermost layer among the plurality of wiring layers. The wiring layer WL4 is covered with the insulating layer 16 which is an inorganic insulating layer made of an inorganic material. However, openings are partially formed in the insulating layer 16, and the wiring layer WL4 is electrically connected to the bump electrode 30 or the bump electrode 31 at the openings formed in the insulating layer 16. The wiring layer WL4 includes the terminal pattern (conductor pattern) TP1 electrically connected to the anode electrode 20EA of the LED element 20A and the terminal pattern (conductor pattern) TP2 electrically connected to the cathode electrode 20EC of the LED element 20A. The wiring layer WL4 includes a terminal pattern (conductor pattern) TP3 electrically connected to the anode electrode 20EA of the LED element 20B and a terminal pattern (conductor pattern) TP4 electrically connected to the cathode electrode 20EC of the LED element 20B. The wiring layer WL4 includes a terminal pattern (conductor pattern) TP5 electrically connected to the anode electrode 20EA of the LED element 20C and a terminal pattern (conductor pattern) TP6 electrically connected to the cathode electrode 20EC of the LED element 20C.

Each of the terminal patterns TP1, TP3, and TP5 has a terminal portion (referred to also as flat portion) connected to the bump electrode 30 at the opening of the insulating layer 16 and a contact portion embedded in a contact hole CH1, a contact hole CH4, or a contact hole CH7 and connected to the wiring layer WL3. The contact portion is covered with the insulating layer 16. Similarly, each of the terminal patterns TP2, TP4, and TP6 has a terminal portion connected to the bump electrode 31 at the opening of the insulating layer 16 and a contact portion embedded in a contact hole CH2, a contact hole CH5, or a contact hole CH8 and connected to the wiring layer WL3. The contact portion is covered with the insulating layer 16. Each of the terminal patterns TP1, TP2, TP3, TP4, TP5, and TP6 is an external terminal of the substrate structure SUB1.

Also, the wiring layer WL3 includes the conductor pattern MP1 made of light shielding metal and electrically connected to the terminal pattern TP1 via the contact hole CH1 formed in the insulating layer 15 and the conductor pattern MP2 made of the same metal as the conductor pattern MP1 and electrically connected to the terminal pattern TP2 via the contact hole CH2 formed in the insulating layer 15. Further, the wiring layer WL3 includes a conductor pattern MP3 made of the same metal as the conductor pattern MP1 and electrically connected to the terminal pattern TP3 via the contact hole CH4 formed in the insulating layer 15. In addition, the wiring layer WL3 includes a conductor pattern MP4 made of the same metal as the conductor pattern MP1 and electrically connected to the terminal pattern TP5 via the contact hole CH7 formed in the insulating layer 15.

Each of conductor patterns MP1, MP3, and MP4 has a flat portion connected to one of the terminal patterns TP1, TP3, and TP5 on a bottom surface of the contact hole CH1, the contact hole CH4, or the contact hole CH7 and a contact portion embedded in a contact hole CH3, a contact hole CH6, or a contact hole CH9 and connected to the wiring layer WL2. As shown in FIG. 3 and FIG. 4, the conductor pattern MP2 is a large-area pattern that occupies most of the wiring layer WL2, and each of the conductor patterns MP1, MP3, and MP4 is arranged in an opening formed in the conductor pattern MP2 so as to be spaced apart from the conductor pattern MP2. In other words, in plan view, the conductor pattern MP2 is arranged so as to be spaced apart from the conductor pattern MP1 and surround the periphery of the conductor pattern MP1. Similarly, in plan view, the conductor pattern MP2 is arranged so as to be spaced apart from the conductor pattern MP3 and surround the periphery of the conductor pattern MP3. Furthermore, in plan view, the conductor pattern MP2 is arranged so as to be spaced apart from the conductor pattern MP4 and surround the periphery of the conductor pattern MP4. In each of the region R1 between the conductor pattern MP2 and the conductor pattern MP1, a region R2 between the conductor pattern MP2 and the conductor pattern MP3, and a region R3 between the conductor pattern MP2 and the conductor pattern MP4, the insulating layer 15 shown in FIG. 5 is arranged.

The wiring layer WL2 shown in FIG. 5 includes the wiring pattern MW1 electrically connected to the conductor pattern MP1 via the contact hole CH3 formed in the insulating layer 14 and electrically connected to the electrode (source electrode ES) of the drive transistor DRT. Also, the wiring layer WL2 includes a wiring pattern MW2 electrically connected to the conductor pattern MP3 via the contact hole CH6 formed in the insulating layer 14 and electrically connected to the electrode (source electrode ES) of the drive transistor DRT. Further, the wiring layer WL2 includes a wiring pattern MW3 electrically connected to the conductor pattern MP4 via the contact hole CH9 formed in the insulating layer 14 and electrically connected to the electrode (source electrode ES) of the drive transistor DRT.

As described above, the LED element 20 emits light in all directions around the LED element 20. Therefore, when each of the materials constituting the substrate structure SUB1 is made of a light-transmitting material, transistors such as the drive transistor DRT are also irradiated with a part of the light. However, studies by the inventor of this application have revealed that, when a thin film transistor is irradiated with light, it may cause deterioration of the characteristics of the thin film transistor or malfunction of the thin film transistor. For example, when a thin film transistor is irradiated with light, a leakage current may be generated in the thin film transistor. For example, in the example shown in FIG. 2, if a leakage current is generated in the drive transistor DRT or the pixel selection transistor SST connected to the holding capacitor Cs, the charge stored in the holding capacitor Cs decreases, resulting in the decrease in luminance. In particular, the LED display device is expected to be used in applications where higher luminance is required as described above. Therefore, the influence caused by irradiating the transistor with light is large.

Therefore, in the case of this embodiment, the conductor pattern MP2 is used as a light shielding film. For example, in the example shown in FIG. 5, the drive transistor DRT is covered with the conductor pattern MP2. In other words, the entire drive transistor DRT is covered with the conductor pattern MP2 in the thickness direction (Z direction in FIG. 5). Therefore, since the conductor pattern MP2 functioning as a light shielding film is interposed between the LED element 20 and the drive transistor DRT, at least the direct irradiation of light from the LED element 20 toward the drive transistor DRT can be prevented. In this way, the deterioration of the characteristics of the drive transistor DRT can be suppressed. As shown in FIG. 6, in the case of this embodiment, each of the reset transistor (switching element) RST, the pixel selection transistor (switching element) SST, the output transistor (switching element) BCT, and the drive transistor (switching element) DRT is entirely covered with the conductor pattern MP2. In this case, the deterioration of the characteristics of each of the reset transistor RST, the pixel selection transistor SST, the output transistor BCT, and the drive transistor DRT can be suppressed.

The conductor pattern MP2 shown in FIG. 5 is connected to the power supply line PL2 shown in FIG. 2 in, for example, the peripheral region PFA shown in FIG. 1. When the power supply line PL2 is formed in the wiring layer WL2 shown in FIG. 5, the conductor pattern MP2 formed in the wiring layer WL3 is electrically connected to the power supply line PL2 via a contact hole (not shown). Further, as a modification, the power supply line PL2 may be formed in the wiring layer WL3 in the same layer as the conductor pattern MP2. In this case, the conductor pattern MP2 and the power line PL2 can be connected without using a contact hole.

Further, the conductor pattern MP2 is connected to the power supply line PL2, and is supplied with the low potential Pvss shown in FIG. 2. The low potential Pvss is a common potential supplied to each of the plurality of pixels PIX. Therefore, as shown in FIG. 3, the conductor pattern MP2 is formed across the plurality of pixels PIX. The drive transistor DRT shown in FIG. 5 is provided in each of the pixels PIXA, PIXB, and PIXC shown in FIG. 3. The drive transistor DRT provided in each of the plurality of pixels PIX is covered with the conductor pattern MP2 formed across the plurality of pixels PIX. In other words, the entire drive transistor DRT provided in each of the plurality of pixels PIX is covered with the conductor pattern MP2 in the thickness direction (Z direction in FIG. 5). When the conductor pattern MP2 is formed across the plurality of pixels PIX, gaps (for example, regions R1, R2, and R3 shown in FIG. 4 and FIG. 5) in the wiring layer WL3 (see FIG. 5) can be made small. As a result, most of the light emitted from each of the LED elements 20A, 20B, and 20C is blocked by the wiring layer WL3, and it is possible to suppress the light irradiation to circuit components including the plurality of transistors between the wiring layer WL3 and the substrate 10 (see FIG. 5).

Note that, although FIG. 5 shows the drive transistor DRT as an example, it is particularly preferable that each of the reset transistor RST, the pixel selection transistor SST, the output transistor BCT, and the drive transistor DRT shown in FIG. 2 is covered with the conductor pattern MP2. In the case of this embodiment, since the conductor pattern MP2 can be formed in most of the wiring layer WL3, it is possible to realize the structure in which each of the reset transistor RST, the pixel selection transistor SST, the output transistor BCT, and the drive transistor DRT shown in FIG. 2 is covered with the conductor pattern MP2. However, some of the plurality of transistors may not be covered with the conductor pattern MP2 depending on the layout. Even in this case, deterioration of characteristics of the transistors covered with the conductor pattern MP2 can be suppressed.

By the way, as a study example with respect to this embodiment, a method in which the conductor pattern of the wiring layer WL3 is used as a terminal without providing the insulating layer 15 and the wiring layer WL4 shown in FIG. 5 is conceivable. In the case of this study example, since the number of wiring layers is smaller than that of this embodiment, it is advantageous in that the manufacturing process can be simplified.

However, this embodiment is more advantageous than the above-mentioned study example in the following points. That is, in the case of this embodiment, the wiring layer WL4 in which the terminal pattern is formed is provided separately from the wiring layer WL3. Consequently, the degree of freedom in layout of the LED elements 20 can be improved. When the terminal pattern for connecting the bump electrode 30 or the bump electrode 31 is formed in the wiring layer WL3, the shape of the conductor pattern formed in the wiring layer WL3 is restricted due to the shape of the LED element 20, the electrode pitch, and the like. On the other hand, in the case of this embodiment, the shape of the terminal pattern in the wiring layer WL4 can be formed in accordance with conditions such as the shape of the LED element and the electrode pitch. Therefore, the shape of the wiring layer WL3 is less likely to be restricted by the shape of the LED element 20, and can be designed relatively freely. Therefore, for example, the conductor pattern MP2 with an appropriate shape from the viewpoint of blocking light irradiated to the transistors can be formed in the wiring layer WL3.

Modification 1

Figure 8:
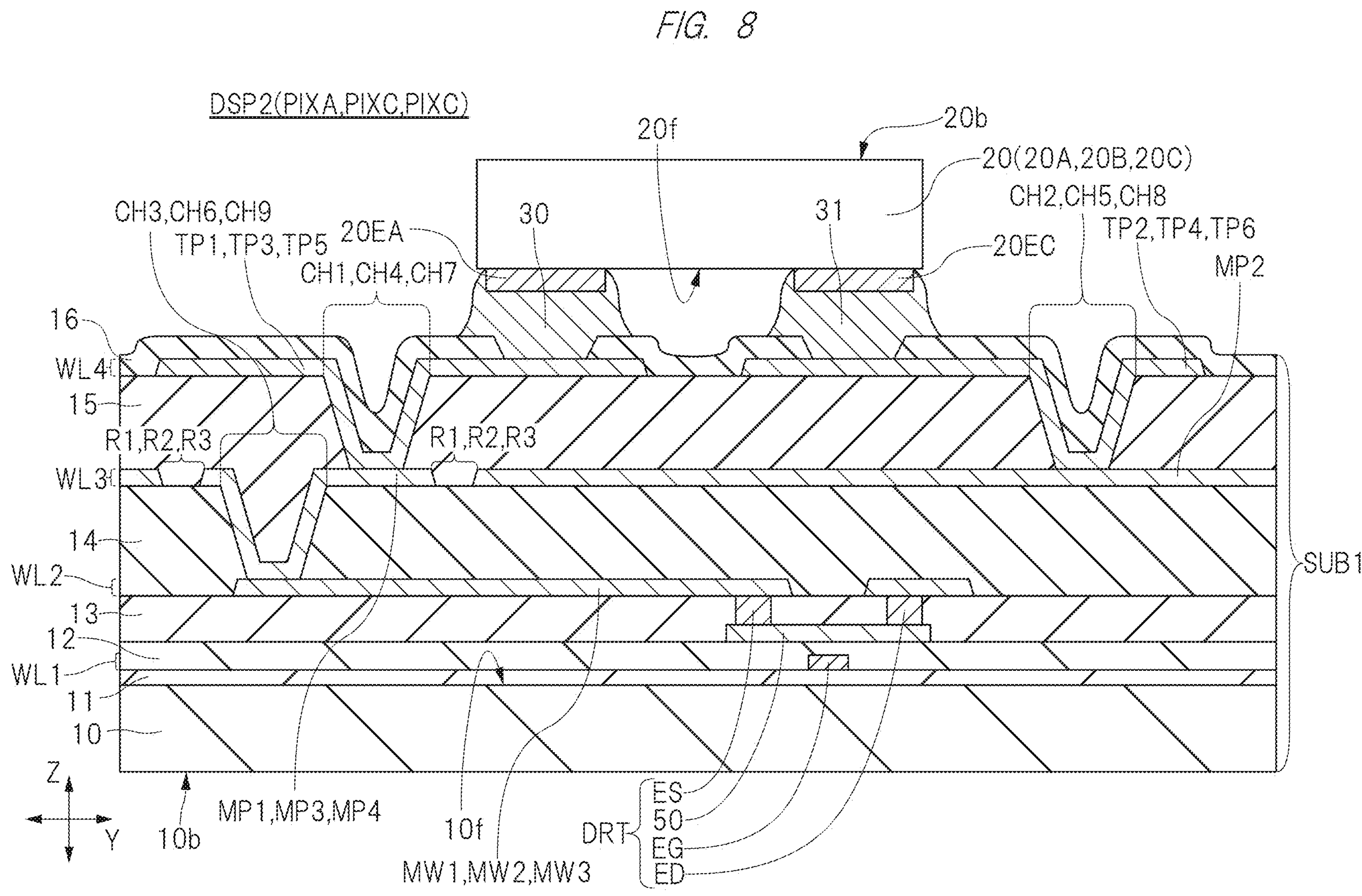
FIG. 8 is an enlarged cross-sectional view taken along the line B-B in FIG. 7.

Next, a modification of the display device DSP1 described with reference to FIG. 1 to FIG. 5 will be described. FIG. 7 is a transparent enlarged plan view showing a modification with respect to FIG. 4. FIG. 8 is an enlarged cross-sectional view taken along the line B-B in FIG. 7.

A display device DSP2 shown in FIG. 7 and FIG. 8 is different from the display device DSP1 shown in FIG. 4 and FIG. 5 in the shape of the terminal patterns TP1, TP3, and TP4 formed in the wiring layer WL4 (see FIG. 5).

Specifically, in the case of the display device DSP2 shown in FIG. 7, the entire conductor pattern MP1 and the region R1 between the conductor pattern MP1 and the conductor pattern MP2 are covered with the terminal pattern TP1. Similarly, in the case of the display device DSP2, the entire conductor pattern MP3 and the region R2 between the conductor pattern MP3 and the conductor pattern MP2 are covered with the terminal pattern TP3. Similarly, in the case of the display device DSP2, the entire conductor pattern MP4 and the region R3 between the conductor pattern MP4 and the conductor pattern MP2 are covered with the terminal pattern TP5.

In other words, in a transparent plan view, the entire conductor pattern MP1 and the region R1 between the conductor pattern MP1 and the conductor pattern MP2 overlap with the terminal pattern TP1. Similarly, in a transparent plan view, the entire conductor pattern MP3 and the region R2 between the conductor pattern MP3 and the conductor pattern MP2 overlap with the terminal pattern TP3. Similarly, in a transparent plan view, the entire conductor pattern MP4 and the region R3 between the conductor pattern MP4 and the conductor pattern MP2 overlap with the terminal pattern TP5.

As described above, the conductor pattern MP2 is a conductor pattern that covers most of the wiring layer WL3 (see FIG. 8). However, in the display region, gaps are formed in the region R1 between the conductor pattern MP1 and the conductor pattern MP2, the region R2 between the conductor pattern MP3 and the conductor pattern MP2, and the region R3 between the conductor pattern MP4 and the conductor pattern MP2. In the case of this modification, in the wiring layer WL3, the terminal patterns TP1, TP3, and TP5 of the wiring layer WL4 are provided so as to cover the gaps between the conductor patterns functioning as light shielding films. As a result, it is possible to more reliably prevent the plurality of transistors arranged between the wiring layer WL3 and the substrate 10 (see FIG. 8) from being irradiated with light.

The display device DSP2 shown in FIG. 7 and FIG. 8 is the same as the display device DSP1 described with reference to FIG. 1 to FIG. 5 except for the above-mentioned differences. Therefore, duplicate descriptions will be omitted.

Modification 2

Figure 9:
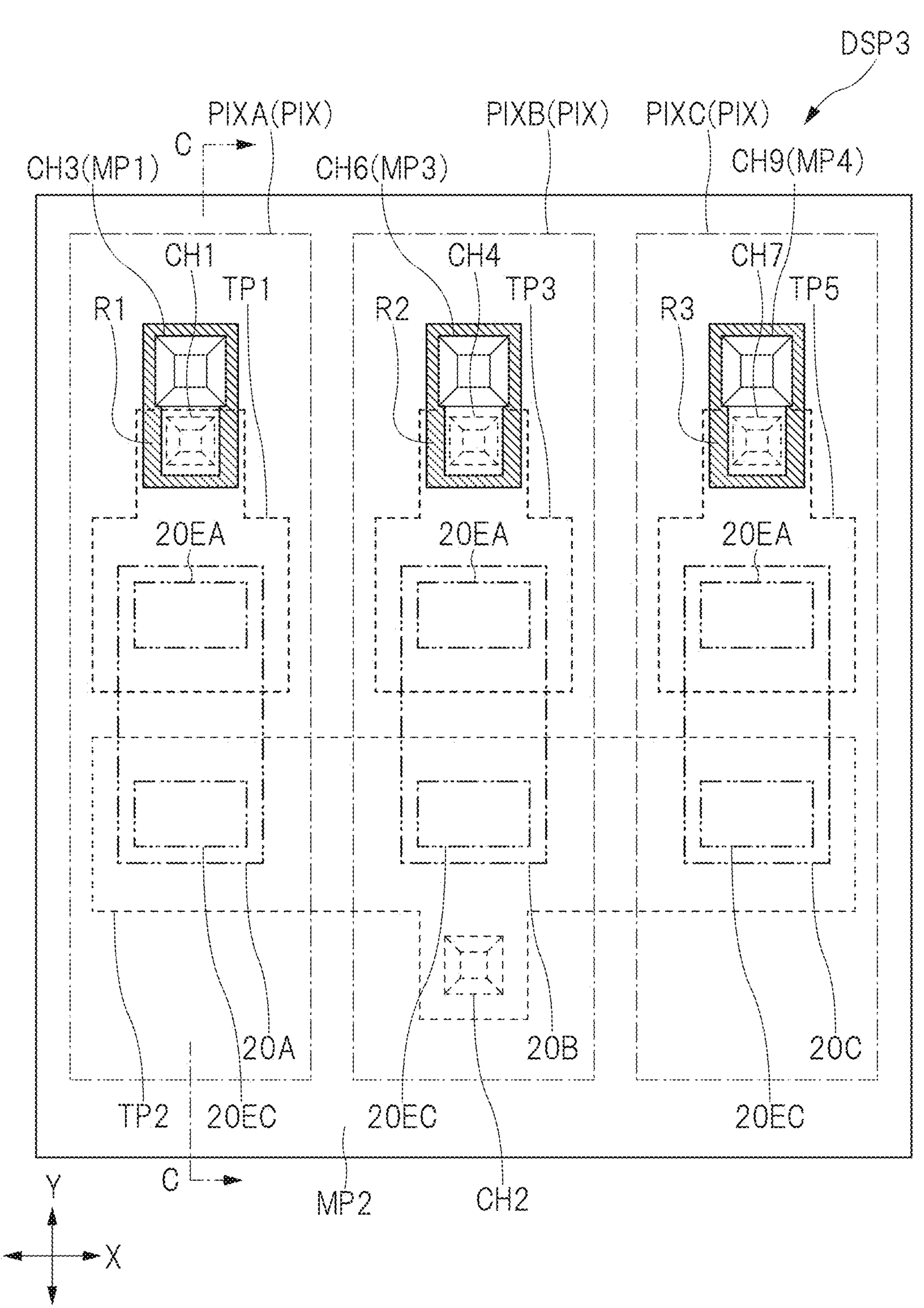
FIG. 9 is a transparent enlarged plan view showing a modification with respect to FIG. 3.
Figure 10:
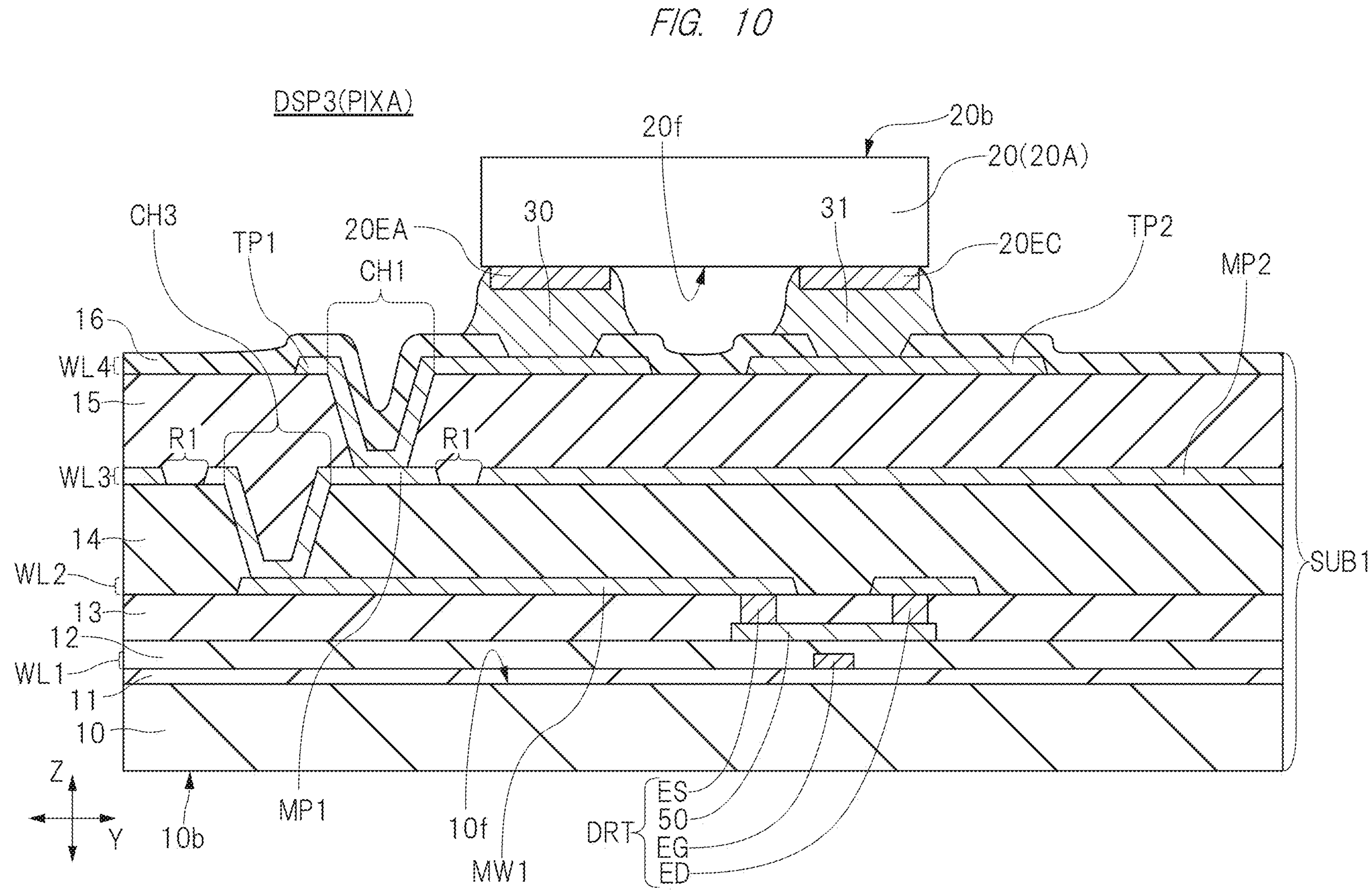
FIG. 10 is an enlarged cross-sectional view taken along the line C-C in FIG. 9.

Next, another modification of the display device DSP1 described with reference to FIG. 1 to FIG. 5 will be described. FIG. 9 is a transparent enlarged plan view showing a modification with respect to FIG. 3. FIG. 10 is an enlarged cross-sectional view taken along the line C-C in FIG. 9. Note that the enlarged cross section of the pixel PIXB shown in FIG. 9 is the same as that in FIG. 5, and the enlarged cross section of the pixel PIXC shown in FIG. 9 is the same as that in FIG. 10.

A display device DSP3 shown in FIG. 9 and FIG. 10 is different from the display device DSP1 shown in FIG. 3 and FIG. 5 in the shape of the terminal pattern TP2 formed in the wiring layer WL4 (see FIG. 5).

Specifically, the terminal pattern TP2 provided in the display device DSP3 is formed across the pixel PIXA, the pixel PIXB, and the pixel PIXC. Further, the terminal pattern TP2 is electrically connected to each of the cathode electrode 20EC of the LED element 20A, the cathode electrode 20EC of the LED element 20B, and the cathode electrode 20EC of the LED element 20C. The cathode electrode 20EC of each of the plurality of LED elements 20 is connected to the power supply line PL2 shown in FIG. 2, and is supplied with the low potential Pvss common to each pixel. Therefore, the terminal pattern TP2 can be arranged across the plurality of pixels PIX as shown in FIG. 9.

By arranging the terminal pattern TP2 across the plurality of pixels PIX, the contact hole CH5 and the contact hole CH8 shown in FIG. 3 become unnecessary. In the case of this modification, the number of contact holes can be reduced, so that the degree of freedom in layout is further improved as compared with the display device DSP1 shown in FIG. 3.

Note that, in the example shown in FIG. 9, the contact hole CH2 is provided in the pixel PIXB. However, the position of the contact hole CH2 is not limited to that shown in FIG. 9, and may be located in, for example, the pixel PIXA or the pixel PIXC. Alternatively, as another modification, the contact hole CH2 may be provided in two pixels of the pixels PIXA, PIXB, and PIXC.

The display device DSP3 shown in FIG. 9 and FIG. 10 is the same as the display device DSP1 described with reference to FIG. 1 to FIG. 5 except for the above-mentioned differences. Therefore, duplicate descriptions will be omitted.

Figure 11:
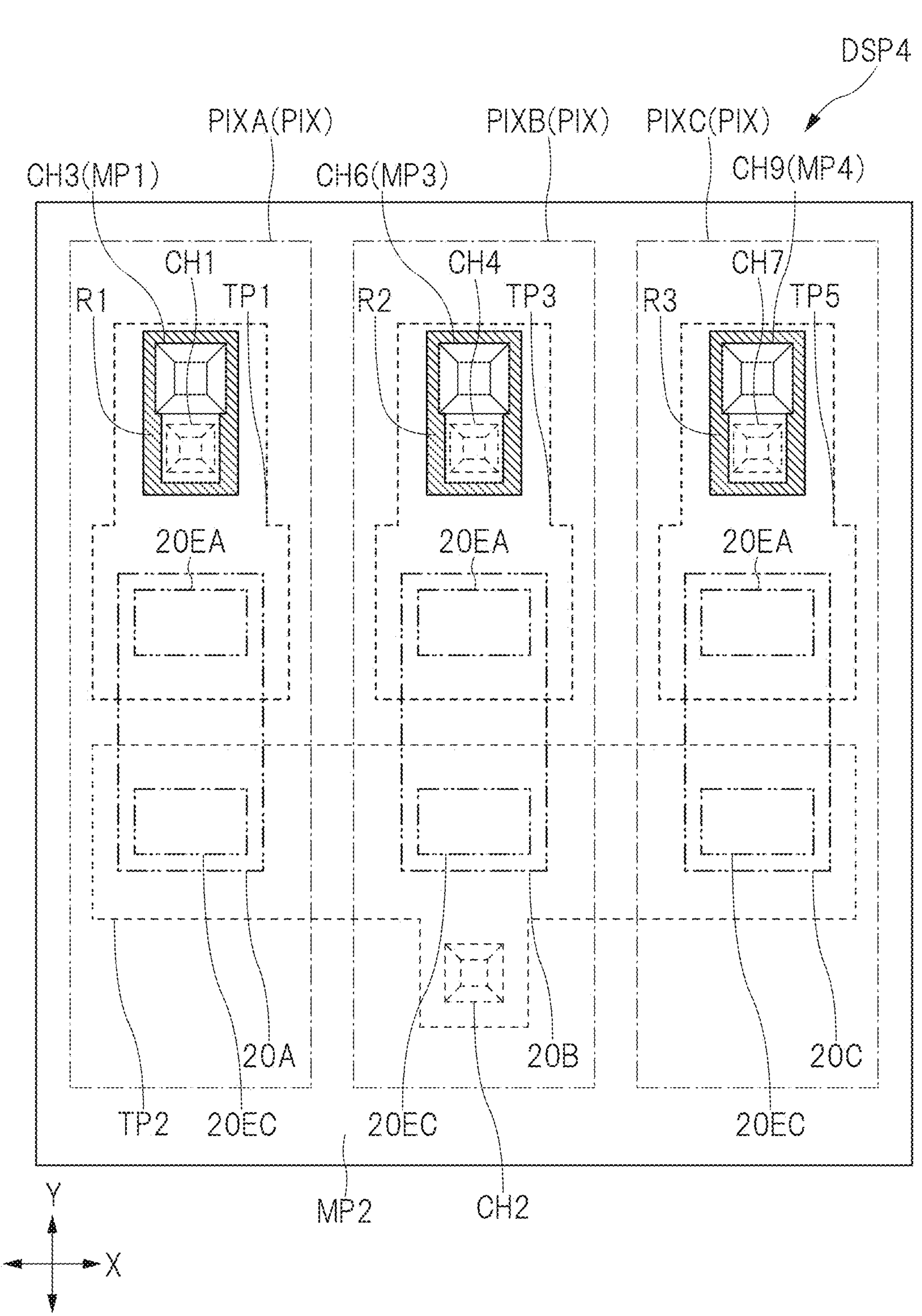
FIG. 11 is a transparent enlarged plan view showing a modification with respect to FIG. 9.

Incidentally, the display device DSP3 described with reference to FIG. 9 and FIG. 10 and the display device DSP2 described with reference to FIG. 7 and FIG. 8 can be combined. FIG. 11 is a transparent enlarged plan view showing a modification with respect to FIG. 9.

A display device DSP4 shown in FIG. 11 is different from the display device DSP3 shown in FIG. 9 in the following points. That is, in the case of the display device DSP4 shown in FIG. 11, the entire conductor pattern MP1 and the region R1 between the conductor pattern MP1 and the conductor pattern MP2 are covered with the terminal pattern TP1. Similarly, in the case of the display device DSP4, the entire conductor pattern MP3 and the region R2 between the conductor pattern MP3 and the conductor pattern MP2 are covered with the terminal pattern TP3. Similarly, in the case of the display device DSP4, the entire conductor pattern MP4 and the region R3 between the conductor pattern MP4 and the conductor pattern MP2 are covered with the terminal pattern TP5.

In the case of the display device DSP4 shown in FIG. 11, similarly to the display device DSP2 shown in FIG. 7 and FIG. 8 described as the modification 1, it is possible to more reliably prevent the plurality of transistors arranged between the wiring layer WL3 (see FIG. 10) and the substrate 10 (see FIG. 10) from being irradiated with light as compared with the display device DSP3 shown in FIG. 9 and FIG. 10.

Although the embodiment and typical modifications have been described above, the above-described technique can be applied to various modifications other than the illustrated modifications. For example, the above-described modifications may be combined with each other.

A person having ordinary skill in the art can make various alterations and corrections within a range of the idea of the present invention, and it is interpreted that the alterations and corrections also belong to the scope of the present invention. For example, the embodiment obtained by performing addition or elimination of components or design change or the embodiment obtained by performing addition or reduction of process or condition change to the embodiment described above by a person having an ordinary skill in the art is also included in the scope of the present invention as long as it includes the gist of the present invention.

The present invention can be applied to display devices and electronic devices incorporating display devices.

What is claimed is:

1. A display device comprising:
- a first substrate;
- a first switching element arranged on the first substrate;
- a plurality of wiring layers stacked on the first substrate;
- a plurality of insulating layers arranged between the plurality of wiring layers; and
- a first inorganic light emitting diode element having a first electrode and a second electrode and mounted on a first wiring layer arranged as an uppermost layer among the plurality of wiring layers,
- wherein the plurality of wiring layers include the first wiring layer, a second wiring layer, and a third wiring layer sequentially stacked from the first wiring layer toward the first substrate,
- wherein the plurality of insulating layers include:
  - a first insulating layer arranged between the first wiring layer and the second wiring layer; and
  - a second insulating layer arranged between the second wiring layer and the third wiring layer,
- wherein the first wiring layer includes:
  - a first terminal pattern electrically connected to the first electrode; and
  - a second terminal pattern electrically connected to the second electrode,
- wherein the second wiring layer includes:
  - a first conductor pattern made of light shielding metal and electrically connected to the first terminal pattern via a first contact hole formed in the first insulating layer; and
  - a second conductor pattern made of the same metal as the first conductor pattern and electrically connected to the second terminal pattern via a second contact hole formed in the first insulating layer,
- wherein the third wiring layer includes a first wiring pattern electrically connected to the first conductor pattern via a third contact hole formed in the second insulating layer and electrically connected to an electrode of the first switching element, wherein the second conductor pattern is arranged so as to be spaced apart from the first conductor pattern and surround a periphery of the first conductor pattern in plan view, and wherein the first switching element is covered with the second conductor pattern.

2. The display device according to claim 1, wherein the entire first conductor pattern and a first region between the first conductor pattern and the second conductor pattern are covered with the first terminal pattern.

3. The display device according to claim 1, further comprising:

a second inorganic light emitting diode element having a third electrode and a fourth electrode and mounted on the first wiring layer; and a second switching element arranged on the first substrate and electrically connected to the second inorganic light emitting diode element, wherein the first wiring layer includes:

a third terminal pattern electrically connected to the third electrode; and a fourth terminal pattern electrically connected to the fourth electrode, wherein the second wiring layer includes a third conductor pattern made of the same metal as the first conductor pattern and electrically connected to the third terminal pattern via a fourth contact hole formed in the first insulating layer, wherein the second conductor pattern is electrically connected to the fourth terminal pattern via a fifth contact hole formed in the first insulating layer, wherein the third wiring layer includes a second wiring pattern electrically connected to the third conductor pattern via a sixth contact hole formed in the second insulating layer and electrically connected to an electrode of the second switching element, wherein the second conductor pattern is arranged so as to be spaced apart from the first conductor pattern and the third conductor pattern and surround each periphery of the first conductor pattern and the third conductor pattern in plan view, and wherein the second switching element is covered with the second conductor pattern.

4. The display device according to claim 3, wherein the entire first conductor pattern and a first region between the first conductor pattern and the second conductor pattern are covered with the first terminal pattern, and wherein the entire third conductor pattern and a second region between the third conductor pattern and the second conductor pattern are covered with the third terminal pattern.

5. The display device according to claim 1, further comprising:

a second inorganic light emitting diode element having a third electrode and a fourth electrode and mounted on the first wiring layer; and a second switching element arranged on the first substrate and electrically connected to the second inorganic light emitting diode element, wherein the first wiring layer includes a third terminal pattern electrically connected to the third electrode, wherein the fourth electrode is electrically connected to the second terminal pattern, wherein the second wiring layer includes a third conductor pattern made of the same metal as the first conductor pattern and electrically connected to the third terminal pattern via a fourth contact hole formed in the first insulating layer, wherein the third wiring layer includes a second wiring pattern electrically connected to the third conductor pattern via a fifth contact hole formed in the second insulating layer and electrically connected to an electrode of the second switching element, wherein the second conductor pattern is arranged so as to be spaced apart from the first conductor pattern and the third conductor pattern and surround each periphery of the first conductor pattern and the third conductor pattern in plan view, and wherein the second switching element is covered with the second conductor pattern.

6. The display device according to claim 5, wherein the entire first conductor pattern and a first region between the first conductor pattern and the second conductor pattern are covered with the first terminal pattern, and wherein the entire third conductor pattern and a second region between the third conductor pattern and the second conductor pattern are covered with the third terminal pattern.

* * * * *